(12) United States Patent
Yeo

(10) Patent No.: US 9,642,292 B2
(45) Date of Patent: May 2, 2017

(54) ELECTROMAGNETIC WAVE REDUCTION APPARATUS AND ELECTROMAGNETIC WAVE REDUCTION METHOD THEREOF

(71) Applicant: Electronics and Telecommunications Research Institute, Daejeon (KR)

(72) Inventor: Soon Il Yeo, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 498 days.

(21) Appl. No.: 14/452,043

(22) Filed: Aug. 5, 2014

(65) Prior Publication Data

US 2015/0208558 A1    Jul. 23, 2015

(30) Foreign Application Priority Data

Jan. 22, 2014    (KR) ........................ 10-2014-0007845

(51) Int. Cl.
*H01F 27/42* (2006.01)
*H01F 37/00* (2006.01)
*H01F 38/00* (2006.01)
*H05K 9/00* (2006.01)
*H02J 50/70* (2016.01)
*H02J 50/00* (2016.01)

(52) U.S. Cl.
CPC ............ *H05K 9/0071* (2013.01); *H02J 50/00* (2016.02); *H02J 50/70* (2016.02)

(58) Field of Classification Search
CPC  H02J 50/00; H02J 50/70; H02J 17/00; H05K 9/0071

USPC ......................................................... 307/104
See application file for complete search history.

(56) References Cited

U.S. PATENT DOCUMENTS

| | | | |
|---|---|---|---|
| 2009/0237323 A1 | 9/2009 | Kwak et al. | |
| 2010/0258155 A1 | 10/2010 | Lee et al. | |
| 2011/0155478 A1* | 6/2011 | Choi | H03K 17/96 |
| | | | 178/18.03 |

FOREIGN PATENT DOCUMENTS

| | | |
|---|---|---|
| KR | 10-2009-0106161 A | 10/2009 |
| KR | 10-2010-0113289 A | 10/2010 |

OTHER PUBLICATIONS

Sangki Park et al., "Performance of Thermoelectric Generator with Various Thermal Conditions of Exhaust Gas from Internal Combustion Engine", KSAE 2010 Annual Conference, pp. 456-460, Nov. 2010.

* cited by examiner

*Primary Examiner* — Carlos Amaya
(74) *Attorney, Agent, or Firm* — Rabin & Berdo, P.C.

(57) ABSTRACT

Provided is an electromagnetic wave reduction apparatus for reducing an electromagnetic wave generated from a thermoelectric element. The electromagnetic wave reduction apparatus according to the present invention includes an electromagnetic wave sensing unit connected to a thermoelectric element and sensing an electromagnetic wave, an electromagnetic wave detecting unit detecting whether the sensed electromagnetic wave is greater than a reference value, an electromagnetic wave reduction circuit unit reducing the electromagnetic wave in response to an electromagnetic wave reduction control signal, and a circuit operation control unit generating the electromagnetic wave reduction control signal according to the detection result.

11 Claims, 5 Drawing Sheets

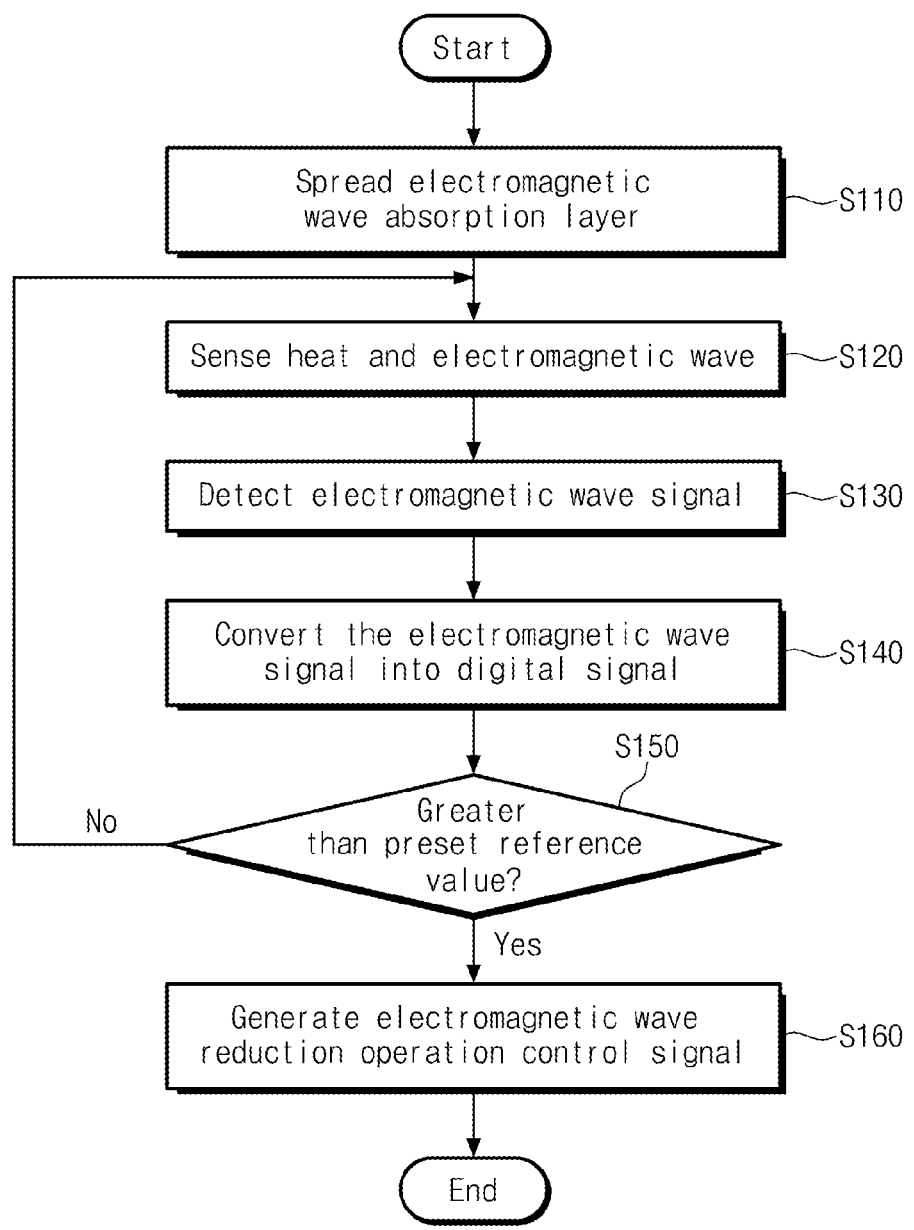

ELECTROMAGNETIC WAVE REDUCTION APPARATUS AND ELECTROMAGNETIC WAVE REDUCTION METHOD THEREOF

CROSS-REFERENCE TO RELATED APPLICATIONS

This U.S. non-provisional patent application claims priority under 35 U.S.C. §119 of Korean Patent Application No. 10-2014-0007845, filed on Jan. 22, 2014, the entire contents of which are hereby incorporated by reference.

BACKGROUND OF THE INVENTION

The present invention disclosed herein relates to an electromagnetic wave reduction apparatus and an electromagnetic wave reduction method thereof, and more particularly, to an electromagnetic wave reduction apparatus for reducing an electromagnetic wave generated from a thermoelectric element and an electromagnetic wave reduction method thereof.

There is a thermoelectric element which is an element using various effects generated by interaction of heat and electricity. Such a thermoelectric element generates electricity and at the same time generates an electromagnetic wave along with the electricity generation.

The electromagnetic wave generated by the thermoelectric element may cause harmful diseases such as a cancer in a human body. In addition, system malfunction and system inability may occur due to electromagnetic wave by the thermoelectric element. Due to theses issues, it is necessary to reduce an electromagnetic wave generated from the thermoelectric element.

SUMMARY OF THE INVENTION

The present invention provides an electromagnetic wave reduction apparatus for reducing an electromagnetic wave generated from a thermoelectric element and an electromagnetic wave reducing method thereof.

The present invention also provides an apparatus an electromagnetic wave reduction apparatus and an electromagnetic wave reducing method thereof for preventing system malfunction and system inability caused by electromagnetic compatibility in a thermoelectric element.

Embodiments of the present invention provide electromagnetic wave reduction apparatuses including: an electromagnetic wave sensing unit connected to a thermoelectric element and sensing an electromagnetic wave; an electromagnetic wave detecting unit determining whether the sensed electromagnetic wave is greater than a reference value; an electromagnetic wave reduction circuit unit reducing the electromagnetic wave in response to an electromagnetic wave reduction control signal; and a circuit operation control unit generating the electromagnetic wave reduction control signal according to the detection result.

In some embodiments, the electromagnetic wave reduction apparatus may further include an electromagnetic wave absorption layer spread on the thermoelectric element for blocking the electromagnetic wave.

In other embodiments, the electromagnetic wave absorption layer may include ferrite.

In still other embodiments, the electromagnetic wave sensing unit may include: an electromagnetic wave sensor sensing the electromagnetic wave generated by the thermoelectric element; a temperature sensor sensing heat generated from the thermoelectric element; an electromagnetic wave sensing control unit detecting an electromagnetic wave based on the electromagnetic wave and the heat; and an analog-to-digital converter converting the detected electromagnetic wave into a digital signal.

In even other embodiments, the temperature sensor may be respectively connected to wires for connecting a capacitor and the thermoelectric element.

In yet other embodiments, the electromagnetic wave detecting unit may include: a memory storing the reference value for detecting the electromagnetic wave; and an electromagnetic wave detecting control unit detecting whether the electromagnetic wave from the thermoelectric element is greater than a preset reference value on the basis of the digitally converted electromagnetic wave and the reference value.

In further embodiments, the circuit operation control unit may include a switch circuit generating the electromagnetic wave reduction control signal when an electromagnetic wave greater than the reference value is generated in response to the detection result.

In still further embodiments, the electromagnetic wave reduction circuit unit may reduce the electromagnetic wave generated by the thermoelectric element by using at least one of a capacitor and a coil.

In other embodiments of the present invention, electromagnetic wave reduction methods of an electromagnetic wave reduction apparatus, the methods include: sensing heat and an electromagnetic wave generated from a thermoelectric element; detecting the electromagnetic wave generated by the thermoelectric element on the basis of the sensed heat and electromagnetic wave; converting the detected electromagnetic wave into a digital signal; detecting whether the digitally converted electromagnetic wave is greater than a preset reference value; and generating a control signal controlling an operation of a circuit for reducing the electromagnetic wave when the electromagnetic wave greater than the reference value is generated.

In some embodiments, the electromagnetic wave reduction method may further include spreading an electromagnetic wave absorption layer on the thermoelectric element for blocking the electromagnetic wave.

In other embodiments, the detecting of the electromagnetic wave may include: detecting the electromagnetic wave from a temperature difference due to the sensed heat; and detecting the electromagnetic wave by combining the detected electromagnetic wave from the thermoelectric element and the electromagnetic wave detected from the temperature difference.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 6 is an exemplary flowchart illustrating an electromagnetic wave reduction operation of an electromagnetic wave reduction apparatus according to an embodiment of the present invention.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In describing the present invention, descriptions or drawings on portions irrelative to the present invention will be omitted so as not to obscure the essential point of the present invention.

The present invention provides an electromagnetic wave reduction apparatus reducing an electromagnetic wave generated from a thermoelectric element. The thermoelectric element is an element using various effects generated by interaction of heat and electricity. For example, as the thermoelectric element, there is a thermistor using a temperature change of electric resistor, an element using a Seeback effect that an electromotive force is generated by a temperature difference, or a Peltier element using a Peltier effect that heat is absorbed or generated by a current.

Figure 1:
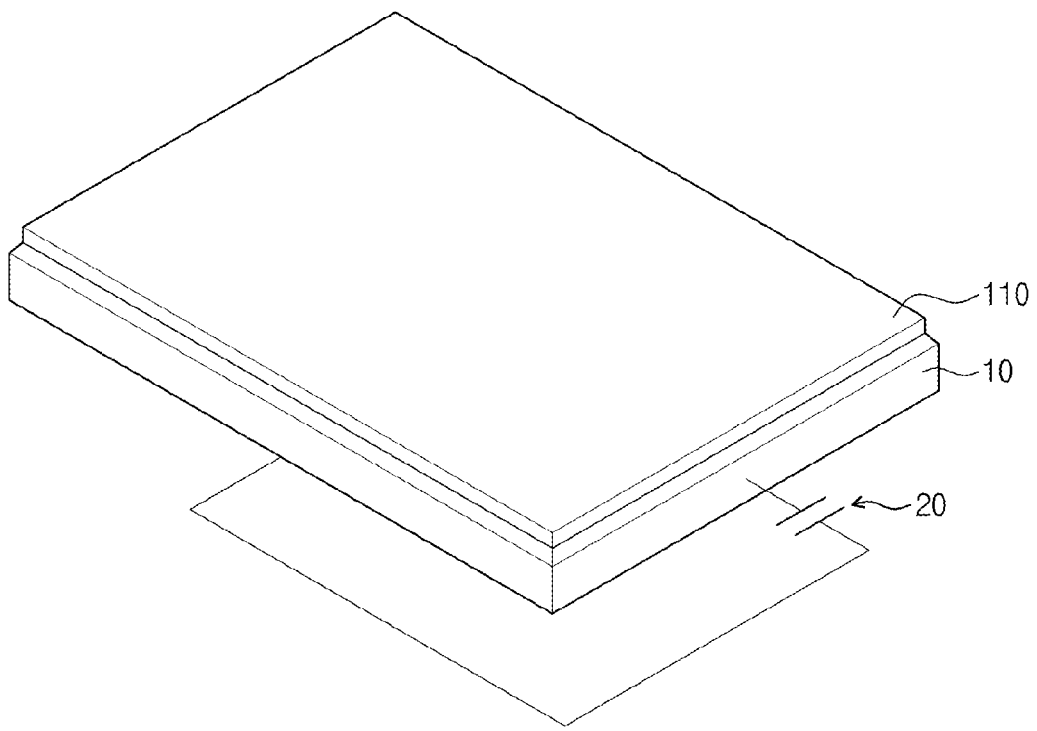
FIG. 1 illustrates an exemplary electromagnetic wave absorption layer of an electromagnetic wave reduction apparatus according to an embodiment of the present invention.

FIG. 1 illustrates an exemplary electromagnetic wave absorption layer of an electromagnetic wave reduction apparatus according to an embodiment of the present invention.

Referring to FIG. 1, a thermoelectric element 10 and a capacitor 20 connected to the thermoelectric element 10 are illustrated.

An electromagnetic wave reduction apparatus according to an embodiment of the present invention includes an absorption layer 110 spread on the thermoelectric element 10. The electromagnetic wave absorption layer 110 may use a paint-type material and as an exemplary material spread on the electromagnetic wave absorption layer 10. For example, the meterial includes ferrite or graphite.

Here, spreading the electromagnetic wave absorption layer 110 on the thermoelectric element 10 is exemplarily illustrated. The electromagnetic wave absorption layer 110 may be spread on a portion in which the electromagnetic wave is generated, or may be spread in a type of enclosing the entire thermoelectric element 10.

Figure 2:
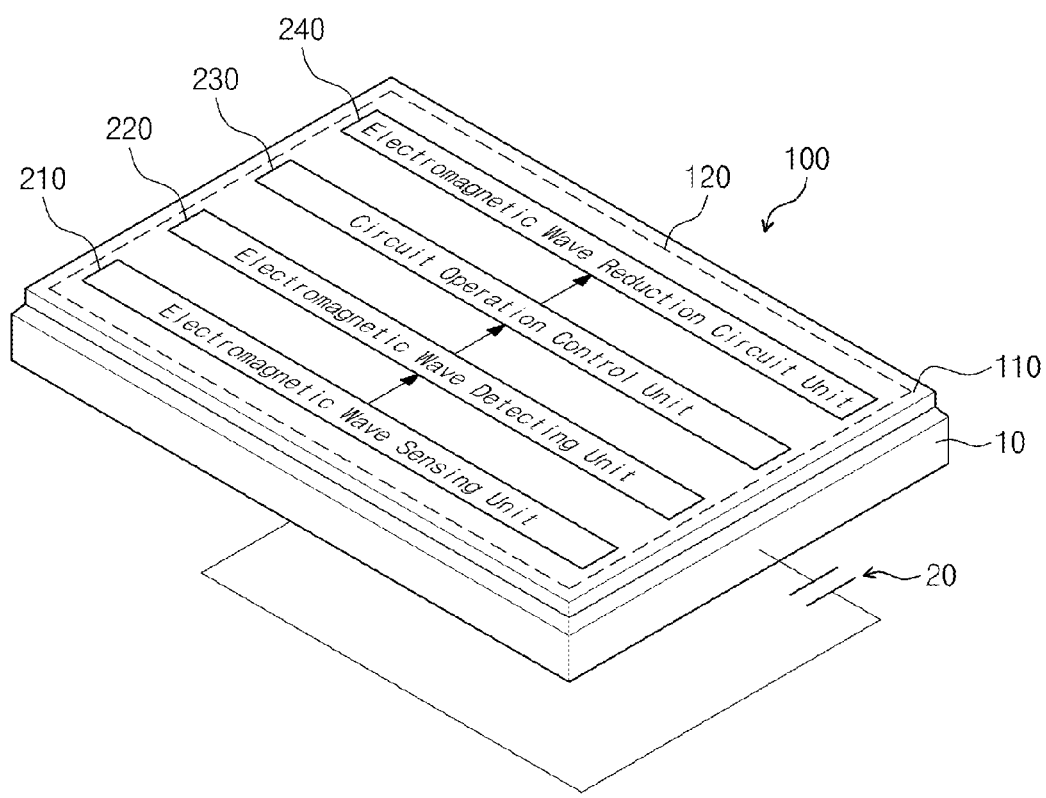
FIG. 2 illustrates an exemplary electromagnetic wave reduction apparatus according to an embodiment of the present invention.

FIG. 2 illustrates an exemplary electromagnetic wave reduction apparatus according to an embodiment of the present invention.

Referring to FIG. 2, the electromagnetic wave reduction apparatus 100 includes the electromagnetic wave absorption layer 110 and an electromagnetic wave reduction circuit 120. Here, the electromagnetic wave reduction circuit 120 may be formed by using a chip or a semiconductor intellectual property (IP) so as to be implemented in a circuit type.

The electromagnetic wave reduction circuit 120 includes an electromagnetic wave sensing unit 210, an electromagnetic wave detecting unit 220, a circuit operation control unit 230, and an electromagnetic wave reduction circuit unit 240.

The electromagnetic wave sensing unit 210 senses an electromagnetic wave signal by using an electromagnetic wave and heat. The electromagnetic wave sensing unit 210 outputs the sensed electromagnetic wave signal to the electromagnetic wave detecting unit 220.

The electromagnetic wave detecting unit 220 detects whether the sensed electromagnetic wave is greater than a preset reference value. The electromagnetic wave detecting unit 220 outputs, to the circuit operation control unit 230, information on whether the sensed electromagnetic wave is greater than the present reference value.

When receiving information that the sensed electromagnetic wave is greater than the preset reference value, the circuit operation control circuit 230 generates an electromagnetic wave reduction control signal. The circuit operation control unit 230 may include a switch circuit and generate the electromagnetic wave reduction control signal.

The electromagnetic wave reduction circuit unit 240 operates a circuit for reducing the electromagnetic wave in response to the electromagnetic wave reduction control signal. The electromagnetic wave reduction circuit unit 240 may include at least one of a capacitor and a coil for reducing the electromagnetic wave, and may include an element, such as a capacitor or a coil, in plurality.

Through this, the electromagnetic wave reduction apparatus 100 according to an embodiment of the present invention reduces the electromagnetic wave by using the electromagnetic wave absorption layer 110 and then reduces again the electromagnetic wave through the electromagnetic wave reduction circuit 120. Through this, an electromagnetic wave generated by the thermoelectric element can be reduced and then reduction performance may be increased.

Figure 3:
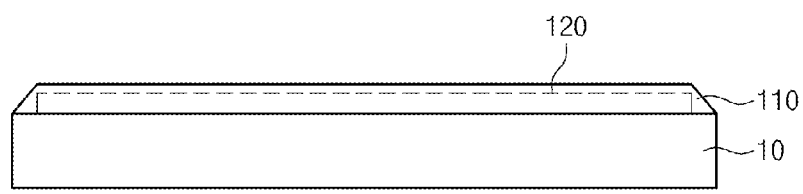
FIG. 3 illustrates an exemplary side surface of the electromagnetic wave reduction apparatus illustrated in FIG. 2.

FIG. 3 illustrates an exemplary side surface of the electromagnetic wave reduction apparatus in FIG. 2.

Referring FIG. 3, the electromagnetic wave reduction apparatus 100 is disposed on the thermoelectric element 10. Here, the electromagnetic wave absorption layer 110 is spread on the thermoelectric element 10 and the electromagnetic wave reduction circuit 120 is disposed between the electromagnetic wave absorption layer 110 and the thermoelectric element 10.

Figure 4:
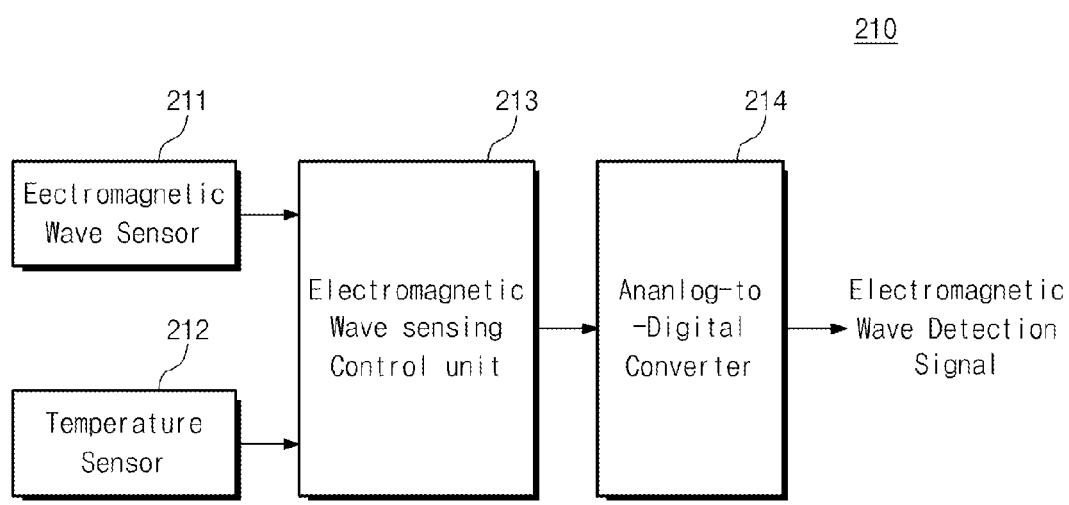
FIG. 4 illustrates a detailed structure of the electromagnetic wave sensing unit illustrated in FIG. 2.

FIG. 4 illustrates an exemplary detailed structure of the electromagnetic wave sensing unit in FIG. 2.

Referring to FIG. 4, the electromagnetic wave sensing unit 210 includes an electromagnetic wave sensor 211, a temperature sensor 212, an electromagnetic wave sensing control unit 213, and an analog-to-digital converter 214.

The electromagnetic wave sensor 211 may sense an electromagnetic wave. The electromagnetic wave sensor 211 outputs the sensed electromagnetic wave to the electromagnetic wave sensing control unit 213.

The temperature sensor 212 measures temperature. For this, the temperature sensor 212 may be respectively connected to wires for connecting the capacitor 20 and the thermoelectric element 10. Through this, the temperature sensor 212 may detect a difference in temperature of both terminals of the thermoelectric element 10. The temperature sensor 212 senses heat, namely, temperature. The temperature sensor 212 outputs the sensed heat to the electromagnetic wave sensing control unit 213.

The electromagnetic wave sensing control unit 213 detects an electromagnetic wave signal generated by the thermoelectric device 10 on the basis of the electromagnetic wave and heat. The electromagnetic wave sensing control unit 213 may detect an electromagnetic wave from an electromotive force generated by heat generation, namely, a temperature difference. The electromagnetic wave sensing control unit 213 combines the electromagnetic wave detected through the electromagnetic wave sensor 211 and the electromagnetic wave detected through the temperature sensor 212. The electromagnetic wave sensing control unit 213 outputs the combined electromagnetic wave signal to the analog-to-digital converter 214.

The analog-to-digital converter 214 converts an input electromagnetic wave signal into a digital signal. The analog-to-digital converter 214 outputs the digitally converted electromagnetic wave to the electromagnetic wave converting unit 220.

Figure 5:
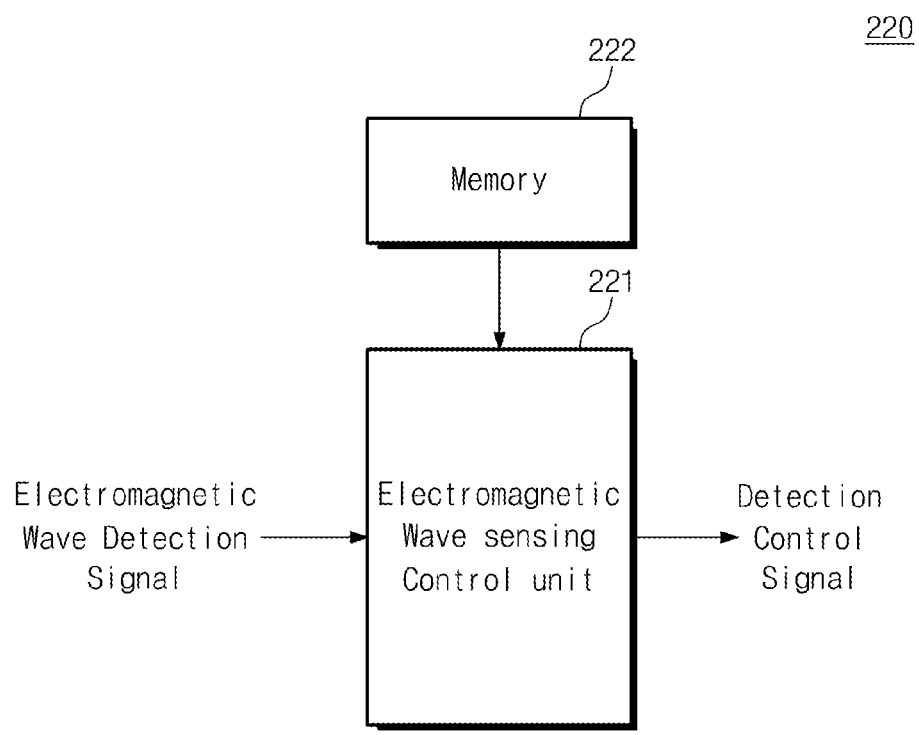
FIG. 5 illustrates a detailed structure of the electromagnetic wave converting unit illustrated in FIG. 2.

FIG. 5 illustrates an exemplary detailed structure of the electromagnetic wave detecting unit in FIG. 2.

Referring to FIG. 5, the electromagnetic wave detecting unit 220 includes electromagnetic wave detecting control unit 221 and a memory 222.

The electromagnetic wave detecting control unit 221 compares the digitally converted electromagnetic wave with the preset reference value, namely, a reference value for reducing the electromagnetic wave. Through this, the electromagnetic wave detecting control unit 221 detects whether the detected electromagnetic wave detected from the thermoelectric device 10 (see FIG. 1) is greater than the reference value.

The electromagnetic wave detecting control unit 221 outputs, to the circuit operation control unit 230, a detection control signal including the detection result of whether to exceed the reference value.

The memory 222 stores the reference value for detecting the electromagnetic wave. Here, the reference value may be determined by using electromagnetic wave compatibility, such as electromagnetic interference and electromagnetic susceptibility.

Here, the electromagnetic wave detecting control unit 221 may obtain the reference value through access to the memory 222.

FIG. 6 is an exemplary flowchart illustrating an electromagnetic wave reduction operation of an electromagnetic wave reduction apparatus according to an embodiment of the present invention.

Referring to FIG. 6, in order to implement the electromagnetic wave reduction apparatus 100, the electromagnetic wave absorption layer 110 is spread on the thermoelectric device.

The electromagnetic wave sensing unit 210 senses heat and an electromagnetic wave generated by the thermoelectric element (operation S120).

The electromagnetic wave sensing unit 210 detects the electromagnetic wave generated by the thermoelectric element on the basis of the sensed heat and electromagnetic wave (operation S130). For this, the electromagnetic wave sensing unit 210 combines the detected electromagnetic wave and the electromagnetic wave obtained through the sensed electromagnetic wave and heat.

The electromagnetic wave sensing unit 210 converts the detected electromagnetic wave into a digital signal (operation S140).

The electromagnetic wave detecting unit 220 detects whether the digitally converted electromagnetic wave is greater than the preset reference value (operation S150).

As a detection result of operation S150, when the electromagnetic wave is greater than the preset reference value, the circuit operation control unit 230 generates a control signal for operating the electromagnetic wave reduction circuit unit 240 for reducing the electromagnetic wave (operation S160).

As the detection result of operation S150, when the value of the electromagnetic wave signal is not greater than the preset reference value, the circuit operation control unit 230 allows the sensing of the heat and the electromagnetic wave to be in a standby state. Accordingly the operation of the electromagnetic wave reduction apparatus 100 is stopped and power consumption can be reduced.

An electromagnetic wave reduction apparatus according to an embodiment of the present invention reduces an electromagnetic wave by using an electromagnetic wave absorption layer and reduces again the electromagnetic wave through the electromagnetic wave reduction circuit. Through this, a reduction ratio for the electromagnetic wave generated by the thermoelectric element can be increased. Furthermore, the electromagnetic wave reduction apparatus according to an embodiment of the present invention detects an electromagnetic wave with respect to a temperature difference of the thermoelectric element in order to consider causes of the electromagnetic wave generation in the thermoelectric element. Through this, the electromagnetic wave reduction apparatus further increases electromagnetic wave reduction efficiency.

An electromagnetic wave reduction apparatus can reduce an electromagnetic wave generated from a thermoelectric element by using an electromagnetic wave absorption layer and an electromagnetic wave reduction circuit. Accordingly, the electromagnetic wave reduction apparatus can prevent system malfunction and system inability caused by electromagnetic wave compatibility by reducing an electromagnetic wave generated by the thermoelectric element.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electromagnetic wave reduction apparatus, comprising:
   an electromagnetic wave sensing unit connected to a thermoelectric element and sensing an electromagnetic wave;
   an electromagnetic wave detecting unit detecting whether the sensed electromagnetic wave is greater than a reference value;
   an electromagnetic wave reduction circuit unit reducing the electromagnetic wave in response to an electromagnetic wave reduction control signal; and
   a circuit operation control unit generating the electromagnetic wave reduction control signal according to the detection result.

2. The electromagnetic wave reduction apparatus of claim 1, further comprising an electromagnetic wave absorption layer spread on the thermoelectric element for blocking the electromagnetic wave.

3. The electromagnetic wave reduction apparatus of claim 2, wherein the electromagnetic wave absorption layer comprises ferrite.

4. The electromagnetic wave reduction apparatus of claim 2, wherein the electromagnetic wave sensing unit comprises,
   an electromagnetic wave sensor sensing the electromagnetic wave generated by the thermoelectric element;
   a temperature sensor sensing heat generated from the thermoelectric element;
   an electromagnetic wave sensing control unit detecting an electromagnetic wave based on the electromagnetic wave and the heat; and an analog-to-digital converter converting the detected electromagnetic wave into a digital signal.

5. The electromagnetic wave reduction apparatus of claim 4, wherein the temperature sensor is respectively connected to wires for connecting the capacitor and the thermoelectric element.

6. The electromagnetic wave reduction apparatus of claim 4, wherein the electromagnetic wave detecting unit comprises:
a memory storing the reference value for detecting the electromagnetic wave; and
an electromagnetic wave detecting control unit detecting whether the electromagnetic wave from the thermoelectric element is greater than a preset reference value on the basis of the digitally converted electromagnetic wave and the reference value.

7. The electromagnetic wave reduction apparatus of claim 6, wherein the circuit operation control unit comprises a switch circuit generating the electromagnetic wave reduction control signal when an electromagnetic wave greater than the reference value is generated in response to the detection result.

8. The electromagnetic wave reduction apparatus of claim 7, wherein the electromagnetic wave reduction circuit unit reduces the electromagnetic wave generated by the thermoelectric element by using at least one of a capacitor and a coil.

9. An electromagnetic wave reduction method of an electromagnetic wave reduction apparatus, the method comprising:

sensing heat and an electromagnetic wave generated from a thermoelectric element;
detecting the electromagnetic wave generated by the thermoelectric element on the basis of the sensed heat and electromagnetic wave;
converting the detected electromagnetic wave into a digital signal;
detecting whether the digitally converted electromagnetic wave is greater than a preset reference value; and
generating a control signal controlling an operation of a circuit for reducing the electromagnetic wave when the electromagnetic wave greater than the reference value is generated.

10. The electromagnetic wave reduction method of claim 9, further comprising spreading an electromagnetic wave absorption layer on the thermoelectric element for blocking the electromagnetic wave.

11. The electromagnetic wave reduction method of claim 9, wherein the detecting of the electromagnetic wave comprises:
detecting the electromagnetic wave from a temperature difference due to the sensed heat; and
detecting the electromagnetic wave by combining the detected electromagnetic wave from the thermoelectric element and the electromagnetic wave detected from the temperature difference.

* * * * *